(12) United States Patent
Hao (10) Patent No.: US 10,345,664 B2
(45) Date of Patent: Jul. 9, 2019

(54) LIQUID CRYSTAL DISPLAY PANEL, ARRAY SUBSTRATE AND METHODS FOR MANUFACTURING THE SAME

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 216 days.

(21) Appl. No.: 15/124,352

(22) PCT Filed: Jul. 5, 2016

(86) PCT No.: PCT/CN2016/088495
§ 371 (c)(1),
(2) Date: Sep. 8, 2016

(87) PCT Pub. No.: WO2017/206262
PCT Pub. Date: Dec. 7, 2017

(65) Prior Publication Data
US 2018/0217460 A1    Aug. 2, 2018

(30) Foreign Application Priority Data
Jun. 1, 2016  (CN) .......................... 2016 1 0383643

(51) Int. Cl.
*G02F 1/1343* (2006.01)
*G02F 1/1333* (2006.01)
(Continued)

(52) U.S. Cl.
CPC ...... *G02F 1/136286* (2013.01); *G02F 1/1368* (2013.01); *G02F 1/134309* (2013.01);
(Continued)

(58) Field of Classification Search
CPC .. G02F 1/1333; G02F 1/136; G02F 1/136286; G02F 1/1368; G02F 1/134309;
(Continued)

(56) References Cited

U.S. PATENT DOCUMENTS 8,537,298 B2   9/2013  Anjo et al.
8,730,421 B2   5/2014  Anjo et al.
(Continued)

FOREIGN PATENT DOCUMENTS

CN         103295959 A     9/2013

*Primary Examiner* — Thoi V Duong
(74) *Attorney, Agent, or Firm* — Andrew C. Cheng (57) ABSTRACT

The present invention provides a liquid crystal display panel, array substrate and method for manufacturing the same. The method for manufacturing the array substrate comprises the steps of: arranging simultaneously a patterned gate layer and common electrodes on a substrate; covering a gate insulating layer on the patterned gate layer, the common electrode and the substrate; arranging a semiconductor layer on the gate insulating layer; arranging a source/drain electrode pattern layer on the semiconductor layer, and arranging pixel electrodes and data lines on the gate insulating layer simultaneously; and covering a passivation layer on the source/drain electrode pattern layer, the semiconductor layer, the pixel electrodes and the data lines. The pixel aperture ratio and transmittance can be increased, and achieving a better displaying effect by the present invention.

12 Claims, 10 Drawing Sheets

(51) Int. Cl.
*G02F 1/1362* (2006.01)
*G02F 1/1368* (2006.01)
*H01L 27/12* (2006.01)

(52) U.S. Cl.
CPC .. *G02F 1/134363* (2013.01); *G02F 1/136227* (2013.01); *H01L 27/124* (2013.01); *H01L 27/1262* (2013.01); *G02F 2001/134318* (2013.01); *G02F 2001/136295* (2013.01)

(58) Field of Classification Search
CPC ......... G02F 1/133345; G02F 1/134363; G02F 1/133512; G02F 1/133514; G02F 1/1343; G02F 1/1339; G02F 1/136209; G02F 1/134336; G02F 1/1362; G02F 1/133707; G02F 2001/134318; G02F 2001/136218; G02F 2001/133357; G02F 2201/124; G02F 2201/501; H01L 27/3276; H01L 27/3262; H01L 27/3248; H01L 29/4908; H01L 29/786; G06F 3/0412; G09G 3/3688; G09G 3/3677; G09G 3/3648; G09G 2300/0426

USPC ....................................................... 349/141
See application file for complete search history.

(56) References Cited

U.S. PATENT DOCUMENTS

| | | | |
|---|---|---|---|
| 8,891,050 B2 | 11/2014 | Kim et al. | |
| 8,895,428 B2 | 11/2014 | Qin | |
| 8,928,830 B2 | 1/2015 | Anjo et al. | |
| 2004/0109122 A1* | 6/2004 | Kumagawa | G02F 1/134363 349/143 |
| 2005/0253978 A1* | 11/2005 | Chae | G02F 1/134363 349/43 |
| 2006/0001814 A1* | 1/2006 | Paik | G02F 1/136209 349/141 |
| 2006/0146255 A1 | 7/2006 | Ahn | |
| 2009/0091678 A1 | 4/2009 | Jeong et al. | |
| 2009/0267087 A1* | 10/2009 | Yang | G02F 1/136286 257/88 |

\* cited by examiner

LIQUID CRYSTAL DISPLAY PANEL, ARRAY SUBSTRATE AND METHODS FOR MANUFACTURING THE SAME

FIELD OF THE INVENTION

The present invention relates to a technology of liquid crystal display, and more particularly, to a liquid crystal display panel, array substrate and method for manufacturing the same.

DESCRIPTION OF PRIOR ART

LCD (liquid crystal display) panel is the most widely used flat panel display currently. It has been implemented into a variety of electronic devices gradually, such as mobile phones, PDA (personal digital assistants) digital camera and computer screens or laptop screen with high-resolution color display monitors. By developing and progressing device technology of LCD, the requirements for display quality of the LCD, outward design, low cost, high transmittance, etc. become higher and higher.

LCD with the IPS (In-Plane-Switching) technology can only enable viewers to seethe minor axis of liquid crystal molecules at any time, so the displayed images seen by the viewer at different angles do not have any apparent differences. By this doing, it comparably perfects the view angles of the LCD. The first generation IPS technology provides a whole new liquid crystal arrangement to resolve the defects of TN (twisted nematic) mode so as to achieve a better view angle. The second generation IPS technology (S-IPS i.e., Super-IPS) uses chevron electrodes and dual domain mode to improve IPS mode with gray scale reversal in specific angles. The third generation IPS technology (AS-IPS i.e., Advanced Super-IPS) reduces the distance between the liquid crystal molecules to increase the aperture ratio, so as to obtain higher brightness.

Figure 1:
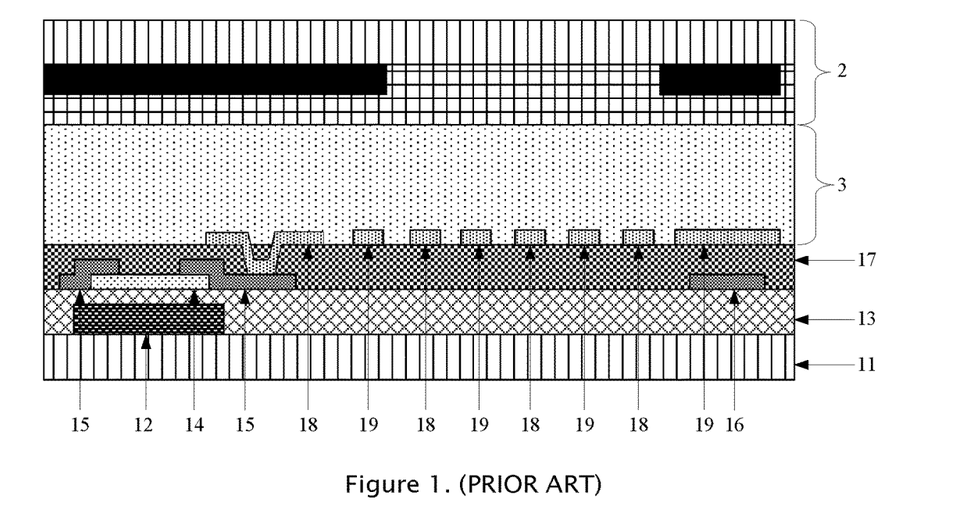
FIG. 1 is a cross sectional view of a conventional LCD.
Figure 2:
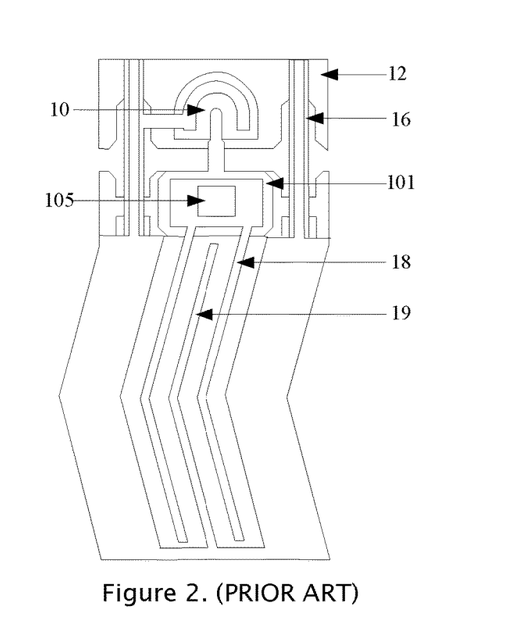
FIG. 2 is an illustrational view of a pixel structure of a conventional LCD panel.

As shown in FIG. 1 and FIG. 2, FIG. 1 is a cross sectional view of a conventional LCD; and FIG. 2 is an illustrational view of a pixel structure of a conventional LCD panel. LCD panel of prior art comprises a TFT (thin-film transistor) substrate 1; a color filter substrate 2 and liquid crystal layer 3 arranged between in the TFT substrate 1 and the color filter substrate 2. Wherein the TFT substrate 1 comprises a glass substrate 11; a gate 12 arranged on the glass substrate 11; a gate insulating layer 13 covered on the gate 12 and the glass substrate 11; a semiconductor layer 14, a source/drain electrode pattern layer 15 and a data line 16 covered on the gate insulating layer 13; a spacer layer 17 covered on the semiconductor layer 14, the source/drain electrode pattern layer 15 and the data line 16; and pixel electrodes 18 and common electrodes 19 arranged on the spacer layer 17. Arranging the TFT substrate 11 of prior art requires three metal layers arranged. The first metal layer is arranged the gate 12. The second metal layer is arranged the source/drain electrode pattern layer 15 and the data line 16. The third metal layer is arranged the pixel electrodes 18 and the common electrodes 19. As shown in FIG. 2, A TFT 10, a storage capacitor 101 the data line 16 are arranged on the gate 12. The common electrodes 19 and the pixel electrodes 18 are arranged on the storage capacitor 101. Wherein a through hole 105 is arranged on the pixel electrodes 18, so the pixel electrodes 18 can connect to the source electrode in the TFT 10 by passing through the through hole 105.

In the existing prior art, a through hole has to be arranged between the pixel electrode and the bridging position of the TFT. When the pixel is small, the pixel aperture will not be negatively affected by through holes and results in low transmittance of LCD.

SUMMARY OF THE INVENTION

The present invention provides a liquid crystal display panel, an array substrate and methods for manufacturing them. Problem of low transmittance because of the pixel aperture is negatively affected by through holes of prior art can be resolved.

In order to resolve the above problem, the present invention utilizes the following technical measurements to resolve encountered by prior arts. Providing a method for manufacturing an array substrate, wherein the method comprises the steps of: arranging simultaneously a patterned gate layer and common electrodes on a substrate; covering a gate insulating layer on the patterned gate layer, the common electrode and the substrate; arranging a semiconductor layer on the gate insulating layer; arranging a source/drain electrode pattern layer on the semiconductor layer, and arranging pixel electrodes and data lines on the gate insulating layer simultaneously; and covering a passivation layer on the source/drain electrode pattern layer, the semiconductor layer, the pixel electrodes and the data lines.

Wherein after the step of covering a passivation layer on the source/drain electrode pattern layer, the semiconductor layer and the pixel electrodes, further comprises: arranging top electrodes on the passivation layer.

Wherein the top electrode is ITO (indium tin oxide) electrode and which is connected to the common electrode.

When the top electrode is metal electrode and which is connected to the common electrode. In the step of arranging top electrodes on the passivation layer comprises: arranging a metal layer on the passivation layer; and arranging top electrodes by using yellow (photolithography) process to pattern top the metal layer.

Wherein the steps of arranging simultaneously a patterned gate layer and common electrodes on a substrate comprises: arranging a first metal layer on the substrate; and arranging a patterned gate layer and common electrodes by using yellow (photolithography) process to pattern the first metal layer.

Wherein the steps of arranging a source/drain electrode pattern layer on the semiconductor layer and arranging simultaneously pixel electrodes and data lines on the gate insulating layer comprises: covering a second metal layer on the semiconductor layer; and arranging a source/drain electrode pattern layer, pixel electrodes and data lines by using yellow (photolithography) process to pattern the second metal layer.

In order to resolve the above problem, the present invention utilizes another following technical measurements to resolve encountered by prior arts. Providing an array substrate, wherein comprises: a substrate; a patterned gate layer and common electrodes arranged on the substrate; a gate insulating layer covered on the patterned gate layer and the common electrode; a semiconductor layer arranged on the gate insulating layer; a source/drain electrode pattern layer arranged on the semiconductor layer; pixel electrodes and data lines arranged on the gate insulating layer; and a passivation layer covered on the source/drain electrode pattern layer, the semiconductor layer, the pixel electrodes and the data lines.

Wherein the substrate further comprises top electrodes on the passivation layer.

Wherein the top electrode is metal electrode or ITO electrode and which is connected to the common electrode.

In order to resolve the above problem, the present invention further utilizes another following technical measurements to resolve encountered by prior arts. Providing a liquid crystal display panel, wherein comprises a color filter substrate; an array substrate and a liquid crystal layer arranged between in the color filter substrate and the array substrate. The array substrate comprising: a substrate; a patterned gate layer and common electrodes arranged on the substrate; a gate insulating layer covered on the patterned gate layer and the common electrode; a semiconductor layer arranged on the gate insulating layer; a source/drain electrode pattern layer arranged on the semiconductor layer; pixel electrodes and data lines arranged on the gate insulating layer; and a passivation layer covered on the source/drain electrode pattern layer, the semiconductor layer, the pixel electrodes and the data lines.

Wherein the array substrate further comprises top electrodes on the passivation layer.

Wherein the top electrode is metal electrode or ITO electrode and which is connected to the common electrode.

The present invention can be concluded with the following advantages, by arranging simultaneously a patterned gate layer and common electrodes, when arranging a source/drain electrode pattern layer, arranging pixel electrodes and data lines simultaneously, so as to reduce one process. Moreover, pixel electrodes and source/drain electrode pattern layer can be located in the same plane so connection the pixel electrodes and the source electrodes can be connected without the implementation of any through holes. The pixel aperture will not be negatively affected by through holes even when the pixel is small, then pixel aperture ratio and transmittance can be increased, and achieving a better displaying effect.

DESCRIPTION OF PREFERRED EMBODIMENT

Technical implementation will be described below clearly and fully by combining with drawings made in accordance with an embodiment in the present invention.

Figure 3:
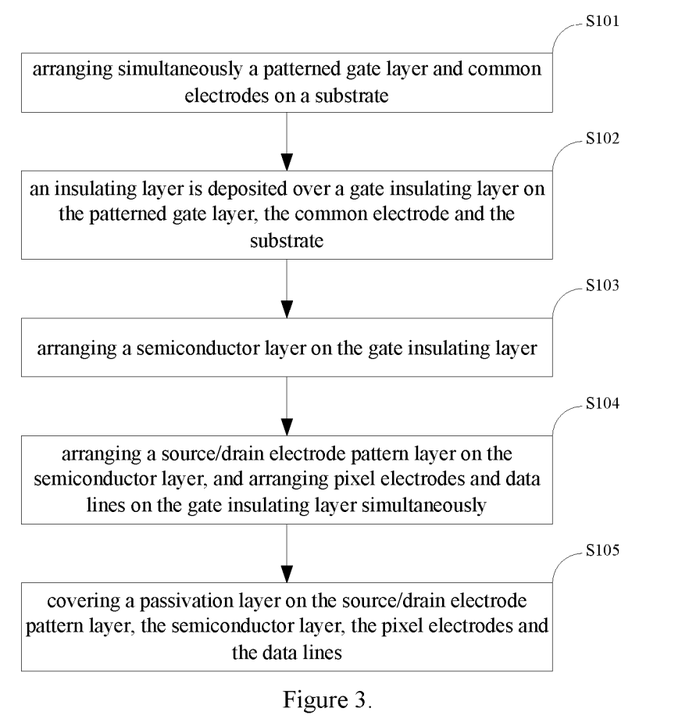
FIG. 3 is a flow chart of the first embodiment made in accordance to method of manufacturing an array substrate in the present invention.

Referring to FIG. 3, FIG. 3 is a flow chart of the first embodiment made in accordance to method of manufacturing an array substrate in the present invention. Specifically, the method comprises the steps of:

In step S101, arranging simultaneously a patterned gate layer 32 and common electrodes 33 on a substrate 31.

Figure 4:
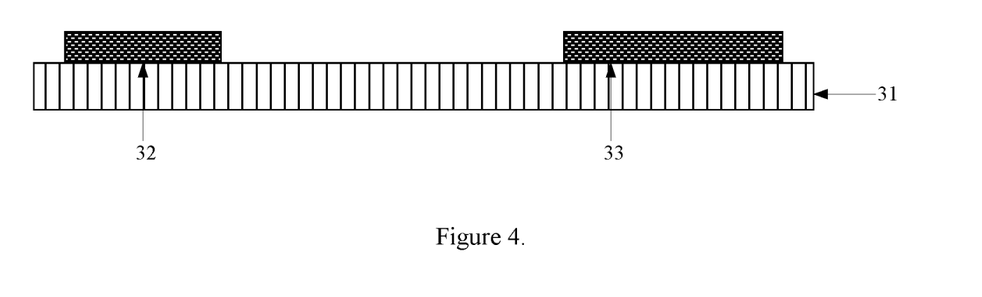
FIG. 4 is an illustration view showing the manufacturing steps of forming a patterned gate layer and a common electrode in accordance to the first embodiment of the present invention.

As shown in FIG. 4 further, FIG. 4 is an illustration view showing the manufacturing steps of forming a patterned gate layer and a common electrode in accordance to the first embodiment of the present invention. In the step S101, a first metal layer is formed on the substrate 31, and further employed with a yellow (photolithography) process, and then the processes of exposing, developing, and eventually etching, and the patterned gate layer 32 and the common electrodes 33 are located in the same plane. The patterned gate layer 32 and the common electrodes 33 are made from copper or aluminum and its alloys or other materials.

Figure 5:
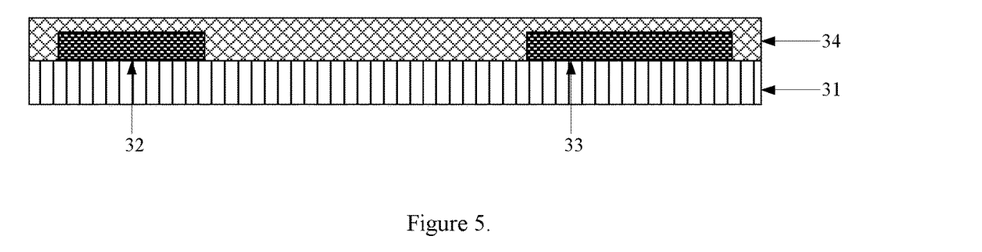
FIG. 5 is an illustration view showing the manufacturing steps of forming a gate insulating layer in accordance to the first embodiment of the present invention.

In step S102, an insulating layer 34 is deposited over a gate insulating layer 34 on the patterned gate layer 32, the common electrode 33 and the substrate 31.

Wherein the gate-insulating layer 34 may be an one-layer structure or a two-layer structure. If the gate-insulating layer 34 is a two-layer structure, the first layer is made form SiNx, SiO or AlO, and its thickness is about 175-300 nm. The second layer is usually made form SiNx, and its thickness is about 300 nm. As shown in FIG. 5, FIG. 5 is an illustration view showing the manufacturing steps of forming a gate-insulating layer in accordance to the first embodiment of the present invention. The gate insulating layer 34 is created by the technology of CVD (chemical vapor deposition) or PECVD (plasma-enhanced chemical vapor deposition.)

In step S103, arranging a semiconductor layer 35 on the gate-insulating layer 34.

Figure 6:
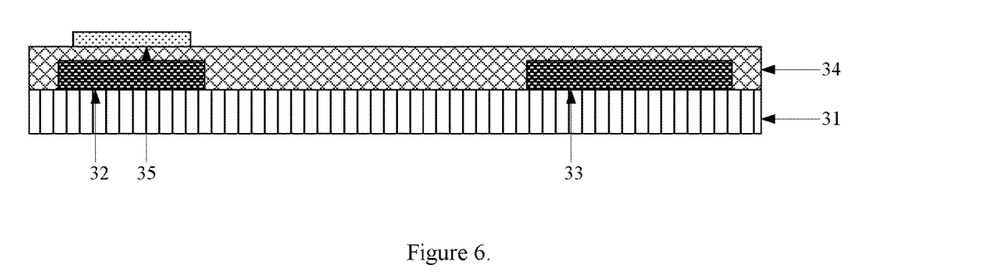
FIG. 6 is an illustration view showing the manufacturing steps of forming a semiconductor layer in accordance to the first embodiment of the present invention.

As shown in FIG. 6, FIG. 6 is an illustration view showing the manufacturing steps of forming a semiconductor layer in accordance to the first embodiment of the present invention. Thickness of the semiconductor layer 35 is 150-350 nm, e.g., 250 nm. The semiconductor layer 35 is also created by the technology of CVD.

In step S104, arranging a source/drain electrode pattern layer 36 on the semiconductor layer 35, and arranging pixel electrodes 37 and data lines 38 on the gate insulating layer 34 simultaneously.

Figure 7:
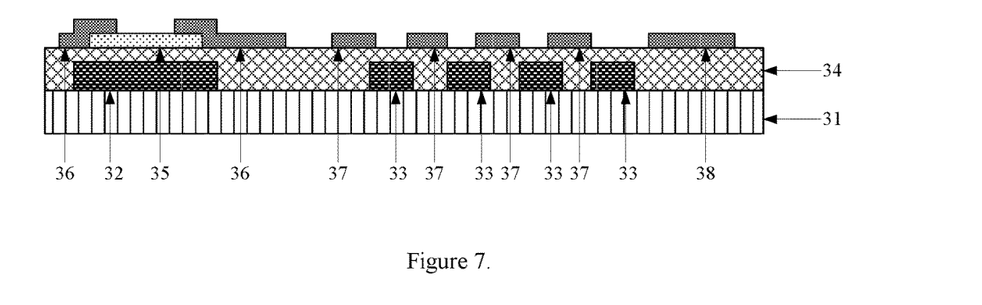
FIG. 7 is an illustration view showing the manufacturing steps of forming a source/drain electrode pattern layer, pixel electrodes and data lines in accordance to the first embodiment of the present invention.

In the step S104, first, arranging a second metal layer on the semiconductor layer and the gate insulating layer 34, and arranging the source/drain electrode pattern layer 36, the pixel electrodes 37 and the data lines 38 by using yellow (photolithography) process with exposure, developing and etching. Referring to FIG. 7, FIG. 7 is an illustration view showing the manufacturing steps of forming a source/drain electrode pattern layer, pixel electrodes and data lines in accordance to the first embodiment of the present invention.

The third metal layer may be made from aluminum alloy, metal aluminum or metal chromium. Thickness of the source/drain electrode pattern layer is 350 nm-450 nm, e.g., 427 nm or 400 nm.

In the step S104, arranging the source/drain electrode pattern layer 36, and arranging simultaneously the pixel electrodes 37 and the data lines 38. The pixel electrodes 37 and the data lines 38 are also metal. Specifically, a part of the source/drain electrode pattern layer 36 is located on top of the semiconductor layer 35, and another part is located on top of the gate-insulating layer 34. And the pixel electrodes 37, the data lines 38, the semiconductor layer 35 and a part of the source/drain electrode pattern layer 36 are located on top of the gate insulating layer 34, i.e., in the same plane. Therefore, connection the pixel electrodes 37 and the source electrodes can be connected without the implementation of any through holes. Problem of low transmittance due to through hole affecting pixel aperture of prior art will not occur, then pixel aperture ratio and transmittance can be increased.

Further, in the embodiment, the first metal layer is arranged the patterned gate layer and the common electrodes, and the second metal layer is arranged the source/drain electrode pattern layer, the pixel electrodes and data lines. Therefore, the third metal layer does not be arranged. By doing so, a manufacturing process can be omitted such that the number of the mask is reduced to four from five.

In step S105, covering a passivation layer 39 on the source/drain electrode pattern layer 36, the semiconductor layer 35, the pixel electrodes 37 and the data lines 38.

Figure 8:
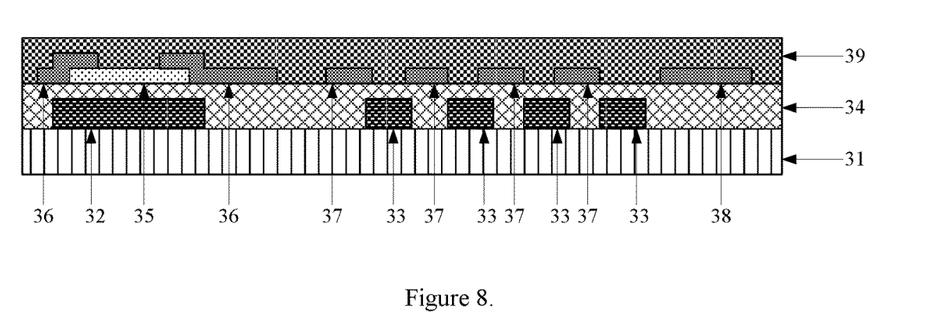
FIG. 8 is an illustration view showing the manufacturing steps of forming a passivation layer in accordance to the first embodiment of the present invention.

The passivation layer 39 is made from silicon nitride in the embodiment, its thickness is 100 nm-300 nm, e.g., 200 nm or 250 nm. The passivation layer 39 can protect components which under it. As shown in FIG. 8, FIG. 8 is an illustration view showing the manufacturing steps of forming a passivation layer in accordance to the first embodiment of the present invention.

Figure 9:
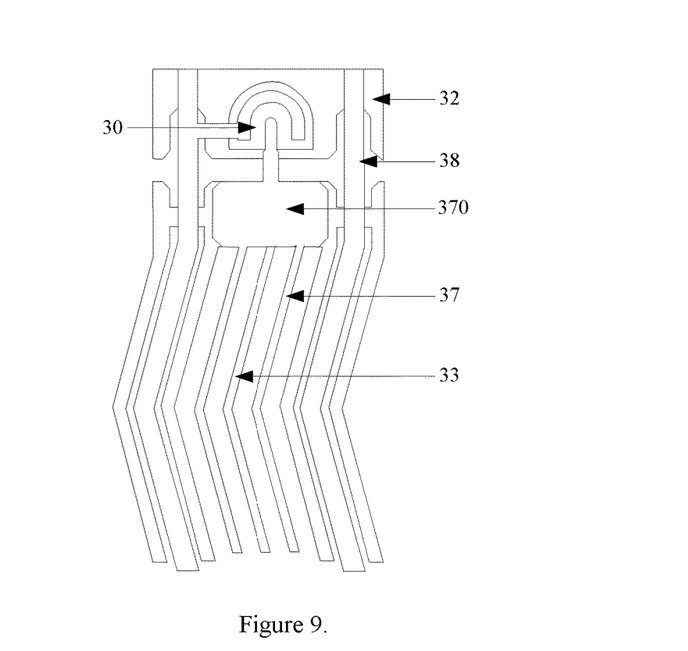
FIG. 9 is an illustrational and configurational view showing a pixel structure in complete state made in accordance with the first embodiment of substrate manufacturing method of the present invention.
Figure 10:
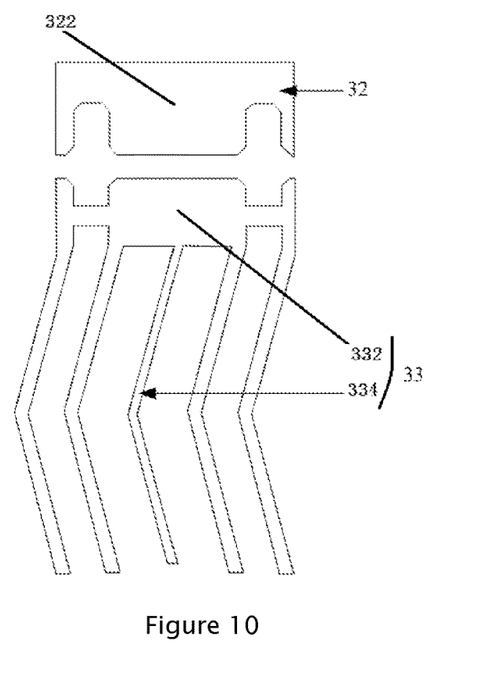
FIG. 10 is an illustrational and configuration view of a patterned gate electrode and a common electrode of the pixel shown in FIG. 9.
Figure 11:
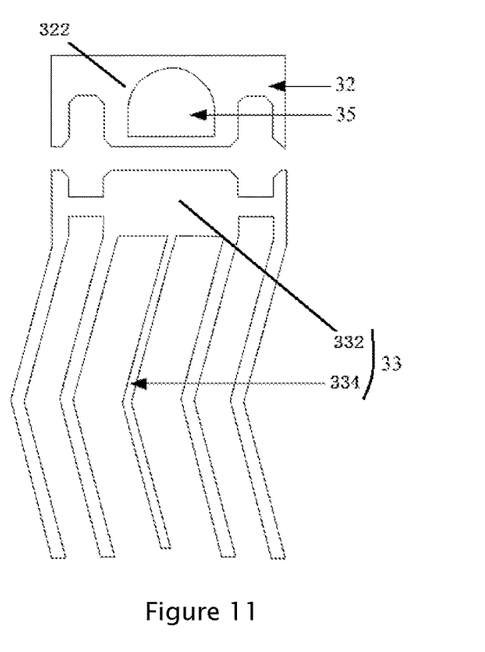
FIG. 11 is an illustrational and configuration view of the semiconductor layer of the pixel shown in FIG. 9.
Figure 12:
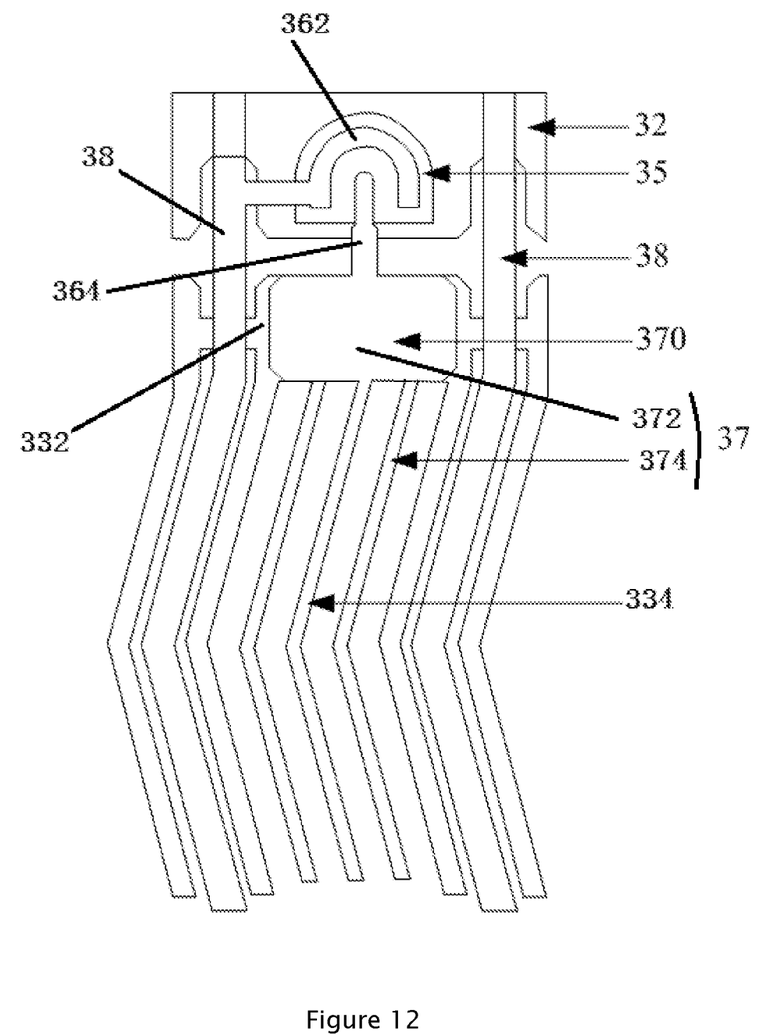
FIG. 12 is an illustrational and configuration view of the pixel electrodes and the data lines of the pixel shown in FIG. 9.

After the above steps, the pixel structural illustration of array substrate is eventually formed shown in FIG. 9. FIG. 9 is an illustrational and configurational plan view showing a pixel structure in complete state made in accordance with the first embodiment of substrate manufacturing method of the present invention. FIG. 10, FIG. 11 and FIG. 12 are layer-by-layer plan views of the pixel of FIG. 9. Wherein FIG. 10 is an illustrational and configuration view of a patterned gate electrode layer 32 and a common electrode 33 of the pixel shown in FIG. 9; FIG. 11 is an illustrational and configuration view of the semiconductor layer 35 of the pixel shown in FIG. 9; and FIG. 12 is an illustrational and configuration view of the pixel electrodes 37 and the data lines 38 of the pixel shown in FIG. 9. In the pixel structural illustration, the patterned gate layer 32 and the common electrode 33 are located in the same plane. In each pixel, the patterned gate electrode layer 32 includes a gate 322, and the common electrode 33 includes a first trunk 332 and a plurality of first branches 334 directly extending from the first trunk 332. The plurality of first branches 334 are spaced apart from each other and curved. The first trunk 332 is located between the gate 322 and the plurality of first branches 334 so that there is not any branch between the gate 322 and the first trunk 332. The semiconductor layer 35 overlaps the gate 322. The pixel electrode 37 includes a second trunk 372 and a plurality of second branches 374 directly extending from the second trunk 372. The plurality of second branches 374 are spaced apart from each other and curved. The source electrode 362 and the drain electrode 364 are spaced apart from each other and electrically connected to the semiconductor layer 35. The source electrode 362 directly extends from the data line 38, and the drain electrode 364 directly extends from the second trunk 372. The second trunk 372 is located between the drain electrode 364 and the plurality of second branches 374 so that there is not any branch between the drain electrode 364 and the second trunk 372. A TFT 30 is arranged on the patterned gate layer 32. A storage capacitor 370 is formed at an overlapped portion between the first trunk 332 and the second trunk 372, and the pixel electrodes 37, the source electrode 362 and the drain electrode 364 in the TFT 30 and the data lines 38 are arranged on the patterned gate layer 32 and the top of the common electrode 33, simultaneously. Because the pixel electrodes 37, the source electrode 362, and the drain electrode 364 are located in the same plane, connection the pixel electrodes 37 and the source electrode 362 can be connected without the implementation of any through holes.

Different from prior art, by arranging simultaneously the patterned gate layer 32 and the common electrodes 33, and when arranging the source/drain electrode pattern layer 36, arranging the pixel electrodes 37 and the data lines 38 simultaneously, so as to reduce one process. Moreover, the pixel electrodes 37 and the source/drain electrode pattern layer 36 can be located in the same plane, so connection the pixel electrodes 37 and the source electrodes can be connected without the implementation of any through holes. Through holes will not affect pixel aperture ratio even when the pixel is small, then pixel aperture ratio and transmittance can be increased, achieving a better displaying effect.

Figure 13:
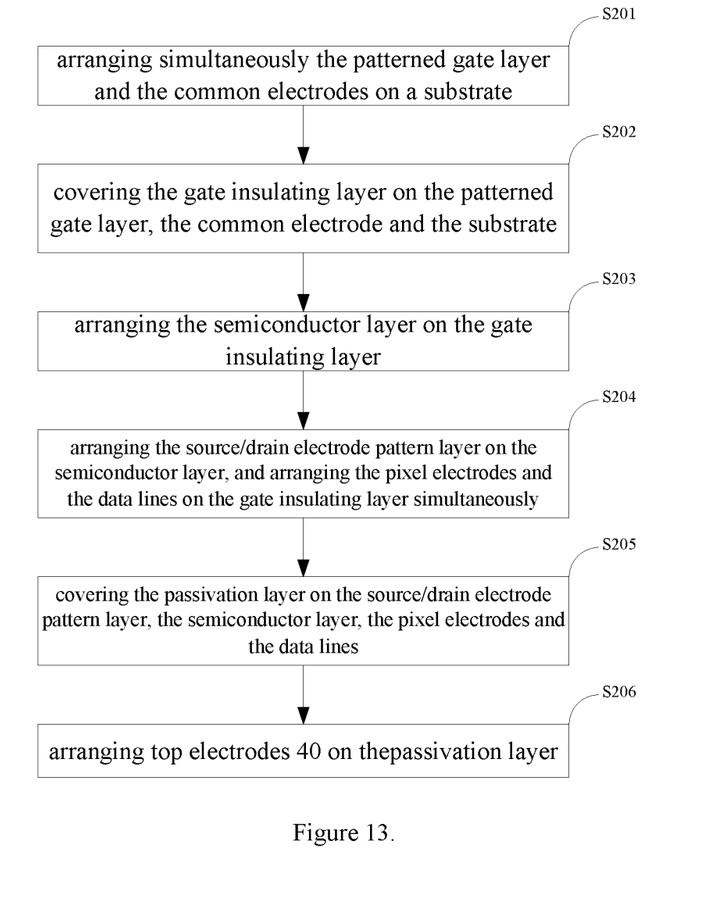
FIG. 13 is a flow chart of the second embodiment made in accordance to method of manufacturing an array substrate in the present invention.

Referring to FIG. 31, FIG. 13 is a flow chart of the second embodiment made in accordance to method of manufacturing an array substrate in the present invention;

In step S201, arranging simultaneously the patterned gate layer 32 and the common electrodes 33 on a substrate 31.

Referring to FIG. 4 further. Specifically, the step of 201 comprises: arranging a first metal layer on the substrate 31; and arranging simultaneously the patterned gate layer 32 and the common electrodes 33 by using yellow (photolithography) process with exposure, developing and etching s to pattern the first metal layer.

In step S202, covering the gate-insulating layer 34 on the patterned gate layer 32, the common electrode 33 and the substrate 31.

Specifically, the gate-insulating layer 34 is created by the technology of CVD or PECVD. Continue to refer to FIG. 5.

In step S203, arranging the semiconductor layer 35 on the gate-insulating layer 32.

Continue to refer to FIG. 5. The semiconductor layer 35 is also created by the technology of CVD.

In step S204, arranging the source/drain electrode pattern layer 36 on the semiconductor layer 35, and arranging the pixel electrodes 37 and the data lines 38 on the gate-insulating layer 34 simultaneously.

The step of 204 comprises: arranging a second metal layer on the semiconductor layer and the gate insulating layer 34; and arranging the source/drain electrode pattern layer 36, the pixel electrodes 37 and the data lines 38 by using yellow (photolithography) process to pattern the second metal layer. Refer to FIG. 5.

In step S205, covering the passivation layer 39 on the source/drain electrode pattern layer 36, the semiconductor layer 35, the pixel electrodes 37 and the data lines 38.

Refer to FIG. 7, the passivation layer 39 may be made from silicon nitride, which is created by the technology of CVD. The passivation layer 39 can protect components such as TFT.

In step S206, arranging top electrodes 40 on the passivation layer 39.

Specifically, the top electrode is metal electrode and which is connected to the common electrode. In the step of arranging top electrodes on the passivation layer comprises: arranging a metal layer on the passivation layer; and arranging top electrodes by using yellow (photolithography) process to pattern top the metal layer.

Specifically, the top electrode 40 is ITO electrode or metal electrode, which is connected to the common electrode 33 to be supplied power by the common electrode 33. The step of 206 comprises: arranging a metal layer on the passivation layer 39; and arranging the top electrodes 40 by using yellow (photolithography) process to pattern top the metal layer.

Figure 14:
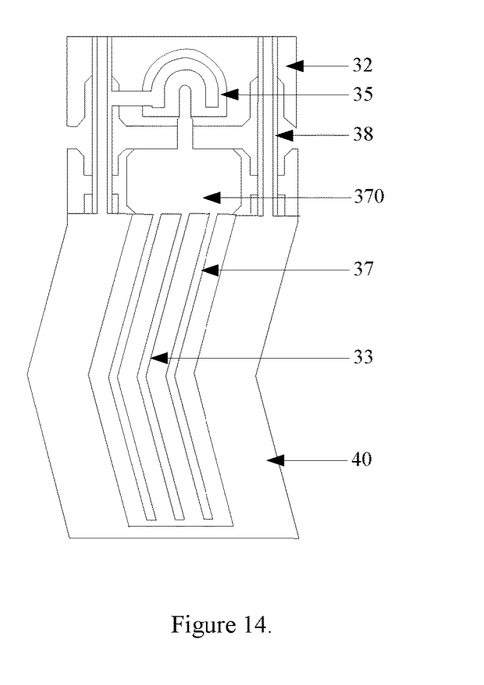
FIG. 14 is an illustrational and configurational view showing a pixel structure in complete state made in accordance with the second embodiment of substrate manufacturing method of the present invention.

As shown in FIG. 14, FIG. 14 an illustrational and configurational view showing a pixel structure in complete state made in accordance with the second embodiment of substrate manufacturing method of the present invention. The patterned gate layer 32 and the common electrode 33 are located in the same plane. The TFT 30 is arranged on the patterned gate layer 32. The storage capacitor 370, the pixel electrodes 37, the source/drain electrode pattern layer in the TFT 30 and the data lines 38 are arranged on the patterned gate layer 32 and the top of the common electrode 33, simultaneously. Because the pixel electrodes 37 and the source/drain electrode pattern layer are located in the same plane, connection the pixel electrodes 37 and the source electrodes can be connected without the implementation of any through holes. The top electrode 40 is further arranged on the layer with the storage capacitor 370, the pixel electrodes 37, the source/drain electrode pattern layer in the TFT 30 and the data lines 38, and which is connected to the common electrode 33.

The present invention further provides an array substrate, as shown in FIG. 8. The array substrate comprising: the substrate 31; the patterned gate layer 32 and the common electrodes 33 arranged on the substrate 31; the gate insulating layer 34 covered on the patterned gate layer 32 and the common electrode 33; the semiconductor layer 35 arranged on the gate insulating layer 34; the source/drain electrode pattern layer 36 arranged on the semiconductor layer 35; the pixel electrodes 37 and the data lines 38 arranged on the gate insulating layer 34; and the passivation layer 39 covered on the source/drain electrode pattern layer 36, the semiconductor layer 35, the pixel electrodes 37 and the data lines 38.

Wherein the patterned gate layer 32 and the common electrode 33 are located in the same plane, which are arranged by the same metal layer. The source/drain electrode pattern layer 36, the pixel electrodes 37 and the data lines 38 are located in the same plane, which are arranged by the same metal layer. Because the pixel electrodes 37 and the source/drain electrode pattern layer 36 are located in the same plane, connection the pixel electrodes 37 and the source electrodes can be connected without the implementation of any through holes. So the pixel aperture will not be negatively affected and transmittance can be increased.

In the other embodiment, the array substrate panel further comprises the top electrodes 40 on the passivation layer 39. As shown in FIG. 14, the top electrode 40 is metal electrode or ITO electrode and which is connected to the common electrode 33.

Figure 15:
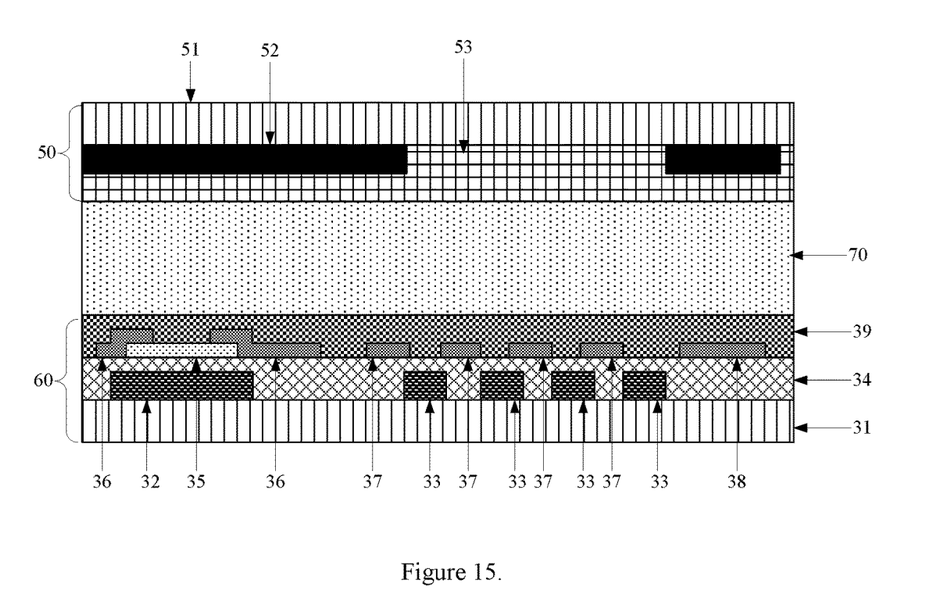
FIG. 15 is a structural illustration of an embodiment made in accordance to method of manufacturing an LCD panel in the present invention.

The present invention further provides a LCD panel, referring to FIG. 15. FIG. 15 is a structural illustration of an embodiment made in accordance to method of manufacturing a LCD panel in the present invention. The LCD panel comprises a color filter substrate 50; and an array substrate 60 and a liquid crystal layer 70 arranged between in the color filter substrate 50 and the array substrate 60. Wherein, the array substrate 60 is the array substrate 60 in any of the above embodiment.

Specifically, the array substrate 60 can be manufactured by a method for manufacturing an array substrate in the present invention.

The processes of manufacturing a color filter substrate 50 are shown as below.

Figure 16:
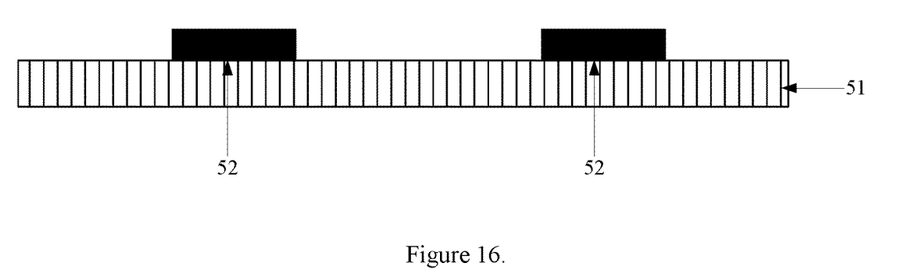
FIG. 16 is an illustrational and configuration view of a black matrix of the pixel shown in manufacturing a color filter substrate of the LCD panel.
Figure 17:
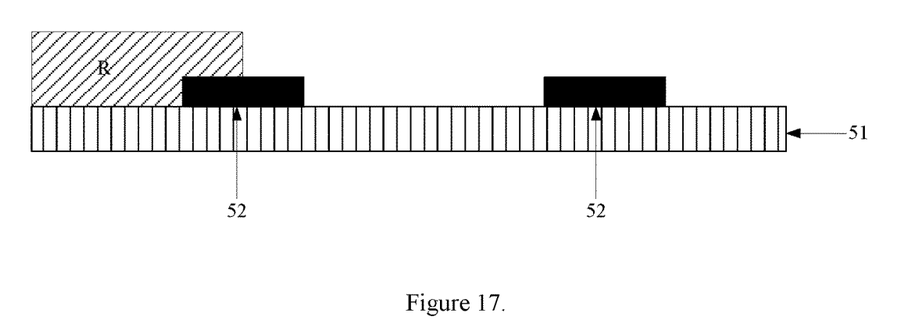
FIG. 17 is an illustrational and configuration view of a red color resist of the pixel shown in manufacturing a color filter substrate of the LCD panel.
Figure 18:
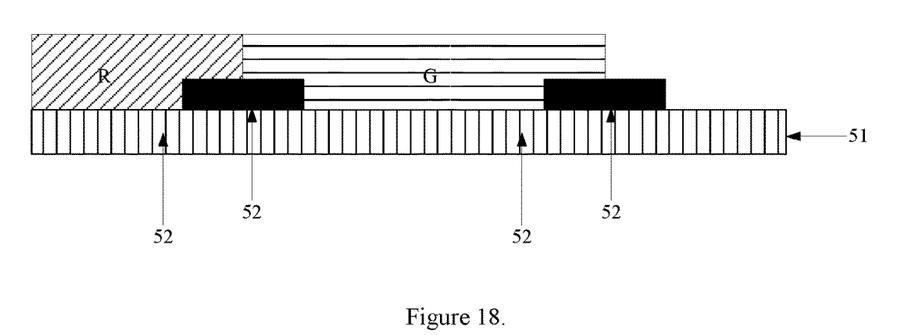
FIG. 18 is an illustrational and configuration view of a green color resist of the pixel shown in manufacturing a color filter substrate of the LCD panel.
Figure 19:
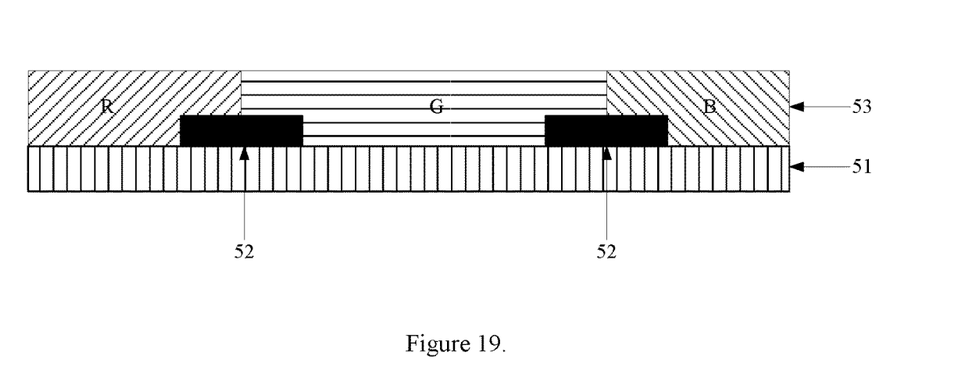
FIG. 19 is an illustrational and configuration view of a blue color resist of the pixel shown in manufacturing a color filter substrate of the LCD panel.

Arranging a black matrix 52 on a substrate 51, as shown in FIG. 16. FIG. 16 an illustrational and configuration view of a black matrix of the pixel shown in manufacturing a color filter substrate of the LCD panel;

Covering color resists with different colors on the substrate 51 and the black matrix 52 to arrange a color resist layer 53, e.g., red color resist, green color resist and blue color resist. Dividing lines in color resists with different colors are arranged on the black matrix 52, as shown in FIG. 19, FIG. 18 and FIG. 19. FIG. 17 is an illustrational and configuration view of a red color resist of the pixel shown in manufacturing a color filter substrate of the LCD panel; FIG. 18 is an illustrational and configuration view of a green color resist of the pixel shown in manufacturing a color filter substrate of the LCD panel; and FIG. 19 is an illustrational and configuration view of a blue color resist of the pixel shown in manufacturing a color filter substrate of the LCD panel.

Figure 20:
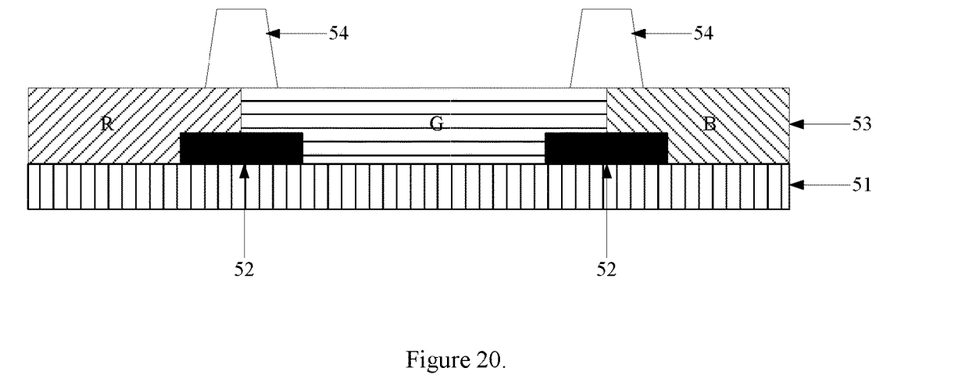
FIG. 20 is an illustrational and configuration view of a support of the pixel shown in manufacturing a color filter substrate of the LCD panel.

Arranging a support 54 on the color resist layer 53. The support 54 is used to maintain the space between the array substrate 60 and the color resist layer 53, as shown in FIG. 20. FIG. 20 is an illustrational and configuration view of a support of the pixel shown in manufacturing a color filter substrate of the LCD panel.

After arranging the array substrate 60 and the color filter substrate 50, the array substrate 60 and the color filter substrate 50 are fabricated by alignment assembly, and arranging the liquid crystal layer 70 between the array substrate 60 and the color filter substrate 50, so as to become the LCD panel of the present invention.

In summary, the pixel aperture ratio and transmittance can be increased, and achieving a better displaying effect by the present invention.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A method of manufacturing array substrate, wherein comprises the steps of:
   arranging simultaneously a patterned gate layer and common electrodes on a substrate, wherein each common electrode comprises a first trunk and a plurality of first branches extending from the first trunk, and the plurality of first branches are curved;
   depositing a gate insulating layer on the patterned gate layer, the common electrode and the substrate;
   arranging a semiconductor layer on the gate insulating layer;
   arranging a source/drain electrode pattern layer on the semiconductor layer, and arranging pixel electrodes and data lines on the gate insulating layer simultaneously, wherein each pixel electrode comprises a second trunk and a plurality of second branches extending from the second trunk, and the plurality of second branches are curved; a drain electrode directly extends from the second trunk;
   depositing a passivation layer on the source/drain electrode pattern layer, the semiconductor layer, the pixel electrodes and the data lines; and
   arranging top electrodes on the passivation layer, wherein the top electrodes are connected to the common electrodes, and the top electrodes cover the data lines and some of the common electrodes that are adjacent to the data lines, so that the pixel electrodes are exposed from gaps between the top electrodes.

2. The method as recited in claim 1, wherein the top electrodes are ITO (indium tin oxide) electrodes.

3. The method as recited in claim 1, wherein the top electrodes are metal electrodes;
   in the step of arranging top electrodes on the passivation layer comprising:
   arranging a metal layer on the passivation layer;
   arranging top electrodes by using yellow (photolithography) process to pattern the metal layer.

4. The method as recited in claim 1, wherein the steps of arranging simultaneously a patterned gate layer and common electrodes on a substrate comprises:
   arranging a first metal layer on the substrate; and
   arranging a patterned gate layer and common electrodes by using yellow (photolithography) process to pattern the first metal layer.

5. The method as recited in claim 1, wherein the steps of arranging a source/drain electrode pattern layer on the semiconductor layer and arranging simultaneously pixel electrodes and data lines on the gate insulating layer comprises:
   arranging a second metal layer on the semiconductor layer; and
   arranging a source/drain electrode pattern layer, pixel electrodes and data lines by using yellow (photolithography) process to pattern the second metal layer.

6. The method as recited in claim 1, wherein all the top electrodes are connected to the common electrodes.

7. An array substrate, wherein comprises:
   a substrate;
   a patterned gate layer and common electrodes arranged on the substrate;
   a gate insulating layer deposited on the patterned gate layer and the common electrode, wherein each common electrode comprises a first trunk and a plurality of first branches extending from the first trunk, and the plurality of first branches are curved;
   a semiconductor layer arranged on the gate insulating layer;
   a source/drain electrode pattern layer arranged on the semiconductor layer;
   pixel electrodes and data lines arranged on the gate insulating layer, wherein each pixel electrode comprises a second trunk and a plurality of second branches extending from the second trunk, and the plurality of second branches are curved; a drain electrode directly extends from the second trunk;
   a passivation layer deposited on the source/drain electrode pattern layer, the semiconductor layer, the pixel electrodes and the data lines; and
   top electrodes on the passivation layer, wherein the source/drain electrode pattern layer, the pixel electrodes and data lines are in direct contact with and between the gate insulating layer and the passivation layer; the top electrodes are connected to the common electrodes, and the top electrodes cover the data lines and some of the common electrodes that are adjacent to the data lines, so that the pixel electrodes are exposed from gaps between the top electrodes.

8. The array substrate as recited in claim 7, wherein the top electrodes are metal electrodes or ITO (indium tin oxide) electrodes.

9. The array substrate as recited in claim 7, wherein all the top electrodes are connected to the common electrodes.

10. A liquid crystal display panel, wherein comprises a color filter substrate, an array substrate and a liquid crystal layer arranged between in the color filter substrate and the array substrate; the array substrate comprising:
    a substrate;
    a patterned gate layer and common electrodes arranged on the substrate;
    a gate insulating layer deposited on the patterned gate layer and the common electrode, wherein each common electrode comprises a first trunk and a plurality of first branches extending from the first trunk, and the plurality of first branches are curved;
    a semiconductor layer arranged on the gate insulating layer;
    a source/drain electrode pattern layer arranged on the semiconductor layer;
    pixel electrodes and data lines arranged on the gate insulating layer, wherein each pixel electrode comprises a second trunk and a plurality of second branches extending from the second trunk, and the plurality of second branches are curved; a drain electrode directly extends from the second trunk;
    a passivation layer deposited on the source/drain electrode pattern layer, the semiconductor layer, the pixel electrodes and the data lines; and
    top electrodes on the passivation layer, wherein the source/drain electrode pattern layer, the pixel electrodes and data lines are in direct contact with and between the gate insulating layer and the passivation layer; the top electrodes are connected to the common electrodes, and the top electrodes cover the data lines and some of the common electrodes that are adjacent to the data lines, so that the pixel electrodes are exposed from gaps between the top electrodes.

11. The liquid crystal display panel as recited in claim 10, wherein the top electrodes are metal electrodes or ITO (indium tin oxide) electrodes.

12. The liquid crystal display panel as recited in claim 10, wherein all the top electrodes are connected to the common electrodes.

\* \* \* \* \*